US006717463B2

(12) United States Patent
Aparin et al.

(10) Patent No.: US 6,717,463 B2
(45) Date of Patent: Apr. 6, 2004

(54) CIRCUIT FOR LINEARIZING ELECTRONIC DEVICES

(75) Inventors: Vladimir Aparin, San Diego, CA (US); Peter J. Shah, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 19 days.

(21) Appl. No.: 09/961,460

(22) Filed: Sep. 21, 2001

(65) Prior Publication Data

US 2002/0067205 A1 Jun. 6, 2002

Related U.S. Application Data

(60) Provisional application No. 60/245,707, filed on Nov. 3, 2000.

(51) Int. Cl.[7] .................................................. H03F 1/26
(52) U.S. Cl. ........................................ 330/149; 330/136
(58) Field of Search ................................ 330/136, 149, 330/283, 179, 284, 298, 132

(56) References Cited

U.S. PATENT DOCUMENTS

| 4,924,194 | A | | 5/1990 | Opas et al. | |
|---|---|---|---|---|---|
| 5,138,275 | A | * | 8/1992 | Abbiati et al. | 330/149 |
| 5,694,069 | A | * | 12/1997 | Kasashima et al. | 327/179 |
| 5,808,511 | A | * | 9/1998 | Kobayashi | 330/149 |
| 6,111,461 | A | * | 8/2000 | Matsuno | 330/132 |
| 6,137,366 | A | * | 10/2000 | King | 330/298 |
| 6,262,631 | B1 | * | 7/2001 | Li | 330/149 |
| 6,353,360 | B1 | * | 3/2002 | Hau et al. | 330/149 |
| 6,437,646 | B2 | * | 8/2002 | Masahiro | 330/284 |

FOREIGN PATENT DOCUMENTS

| JP | 53012213 | 3/1978 |
|---|---|---|
| JP | 56140709 | 4/1981 |

* cited by examiner

*Primary Examiner*—Michael Tokar
*Assistant Examiner*—Linh Van Nguyen
(74) *Attorney, Agent, or Firm*—Philip Wadsworth; Charles D. Brown; Donald C. Kordich

(57) ABSTRACT

A radio frequency amplifier with improved linearity and minimal third-order distortion. The amplifier includes a first transistor having first, second and third terminals with the first terminal being an input terminal and the second terminal being the output terminal and the third terminal being a common terminal. A linearization circuit is included having first and second terminals. The first terminal is connected to the common terminal of the transistor and the second terminal is connected to the input terminal of the transistor. In a specific embodiment, the linearization circuit is implemented as a unity gain buffer with an input terminal connected to the common terminal of the transistor and an output terminal connected to the input terminal of the transistor. In accordance with the inventive teachings, the buffer has a low gain and high output impedance at first frequency ($f_1$) of a first signal applied to the circuit and a second frequency ($f_2$) of a second signal applied to the circuit and a unity gain and low output impedance a difference between the first and second frequencies. In another specific embodiment, the inductor is inserted between the output of the unity gain buffer and the input terminal of the transistor. In alternative embodiments, circuitry is shown for providing a direct current offset at the input of the transistor. As another alternative, the linearization circuit consists of series inductor and capacitor connected between the common and input terminals of the transistor. In yet another embodiment, the linearization circuit consists of the first and the second series inductor and capacitor circuits. The first series LC circuit is connected between the common terminal of the transistor and ground and the second series LC circuit is connected between the input terminal of the transistor and ground.

1 Claim, 6 Drawing Sheets

CIRCUIT FOR LINEARIZING ELECTRONIC DEVICES

This application claims priority from U.S. Provisional Application Serial No. 60/245,707, entitled "CIRCUIT FOR LINEARIZING ELECTRONIC DEVICES," filed Nov. 3, 2000, the content of which is incorporated herein by reference in its entirety.

FIELD OF THE INVENTION

The present invention relates to electronic circuits. More specifically, the present invention relates to systems and methods for linearizing electronic, devices, circuits and systems.

DESCRIPTION OF THE RELATED ART

The front ends of radio frequency (RF) communication systems typically include amplifiers and mixers. The receiver front-end amplifier serves to boost a received RF signal and the mixers serve to downconvert the signal from high RF frequencies to lower frequencies more suitable for processing and output. Unfortunately, when the RF amplifiers and mixers handle desired received signals in a presence of strong interferers, distortion often results from the strong interferers that can degrade the quality of the desired signal. The distortion products that fall in the band of the received signal are most dangerous. They are typically generated due to third degree nonlinearities and called third-order intermodulation (IM3) distortion. With two strong interferers at $f_1=1000$ MHz and $f_2=1001$ MHz, for example, the intermodulation distortion products will be generated at $(2f_1-f_2)$ and $(2f_2-f_1)$. Hence, for the exemplary signals centered at 1000 MHz and 1001 MHz the distortion signals will be centered at 999 MHz and 1002 MHz. If one of these signals falls in band of the desired signal, it may degrade receiver sensitivity.

Conventionally, it is difficult to achieve low levels of the distortion inasmuch as the third degree nonlinearity of the circuit is an inherent property of amplifying active devices. Typically, a lower distortion is achieved at the expense of an increased DC current consumption. The latter is undesirable especially in a wireless communication system powered by a battery where the higher current consumption results in a shorter battery life and, thus, a shorter system operation (for example, the talk time of the cellular phones).

Hence, a need remains in the art for a system or method for improving the linearity of amplifiers and mixers used in RF receivers and other systems without a significant rise in the DC current consumption.

SUMMARY OF THE INVENTION

The need in the art is addressed by the system and method of the present invention. In an illustrative application, the invention is realized as a radio frequency amplifier. The inventive amplifier includes a first transistor having first, second and third terminals. In the illustrative embodiment, the first transistor is bipolar with the first terminal being an input terminal and the second terminal being an output terminal and the third terminal being a common terminal. A linearization circuit is included having first and second terminals. The first terminal is connected to the common terminal of the transistor and the second terminal is connected to the input terminal of the transistor. The linearization circuit doesn't interfere with the transistor amplification of an input RF signal. But, in the presence of two input signals or an input modulated carrier, the linearization circuit forces the control voltage between the input terminal and the common terminal of the transistor to be zero at the difference frequency of the two input signals or at a modulation frequency of the input modulated carrier.

In a specific embodiment, the linearization circuit is implemented as a non-inverting unity gain buffer with an input terminal connected to the common terminal of the transistor and an output terminal connected to the input terminal of the transistor. The buffer is designed so that its gain is unity and its output impedance is low at the difference frequency of the two input signals or at the modulation frequency of the input modulated carrier. It forces the transistor input voltage to follow the common terminal voltage at these low frequencies. The buffer gain is sufficiently low and its output impedance is high in the amplifier operating frequency band to allow the amplification of input signals by the transistor in this band.

In another specific embodiment, the linearization circuit includes a non-inverting unity gain buffer with an input and output terminals and a radio frequency choke coil. The input terminal of the buffer is connected to the common terminal of the transistor and the output terminal is connected to the first terminal of the choke coil. The second terminal of the choke coil is connected to the input terminal of the transistor. In accordance with the inventive teachings, the choke coil has high impedance in the operating frequency band of the amplifier and, thus, isolates the buffer output from the amplifier input in this band. The choke coil has a low impedance at the difference frequency of the two input signals or at the modulation frequency of the input modulated carrier. Thus, the choke doesn't prevent the buffer from forcing the transistor input voltage to follow the common terminal voltage at the mentioned frequencies.

In alternative embodiments, circuitry is shown for providing a DC offset at the input of the transistor. As another alternative, the linearization circuit consists of series inductor and capacitor connected between the common and input terminals of the transistor. This series LC circuit acts as an open circuit in the operating frequency band of the amplifier and as an AC short circuit at the difference frequency of the two input signals or at the modulation frequency of the input modulated carrier.

In yet another embodiment, the linearization circuit consists of the first and the second series inductor and capacitor circuits. The first series LC circuit is connected between the common terminal of the transistor and ground and the second series LC circuit is connected between the input terminal of the transistor and ground.

The inventive method provides increased linearity and minimal third-order distortion in amplifiers, mixers, and other circuits used in high frequency circuits and systems.

DESCRIPTION OF THE INVENTION

Illustrative embodiments and exemplary applications will now be described with reference to the accompanying drawings to disclose the advantageous teachings of the present invention.

The level of the third-order intermodulation (IM3) distortion product generated by a nonlinear circuit at small input power levels is usually estimated from a third-order intercept point (TOIP) measured with a two-tone input signal. This is illustrated in FIGS. 1a and 1b.

Figure 1A:
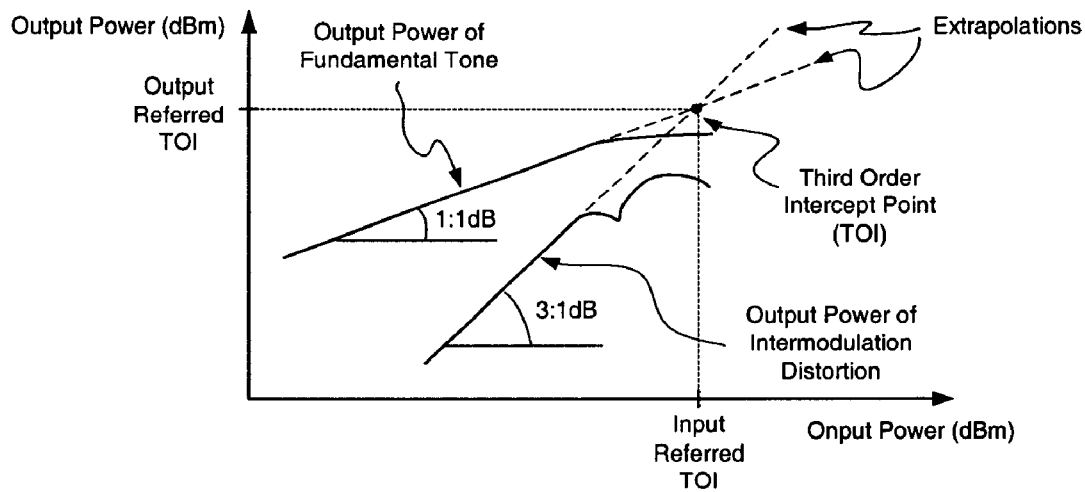
FIG. 1a is a graph of output power verses input power for a typical amplifier showing the third order intercept point between the linearly extrapolated output power associated with fundamental signals and the linearly extrapolated output power associated with third-order intermodulation distortion resulting therefrom.

FIG. 1a is a graph of output power verses input power for a typical RF amplifier showing the third order intercept point between the extrapolated output power associated with fundamental tones and the extrapolated output power associated with intermodulation distortion resulting therefrom. When the two fundamental tones ($f_1$ and $f_2$) representing two interferers are applied to a transistor, its nonlinear characteristics generate spurious responses in the output voltage. This is depicted in FIG. 1b.

Figure 1B:
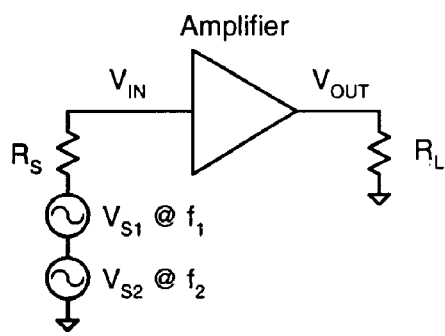
FIG. 1b is a typical RF amplifier.
Figure 1C:
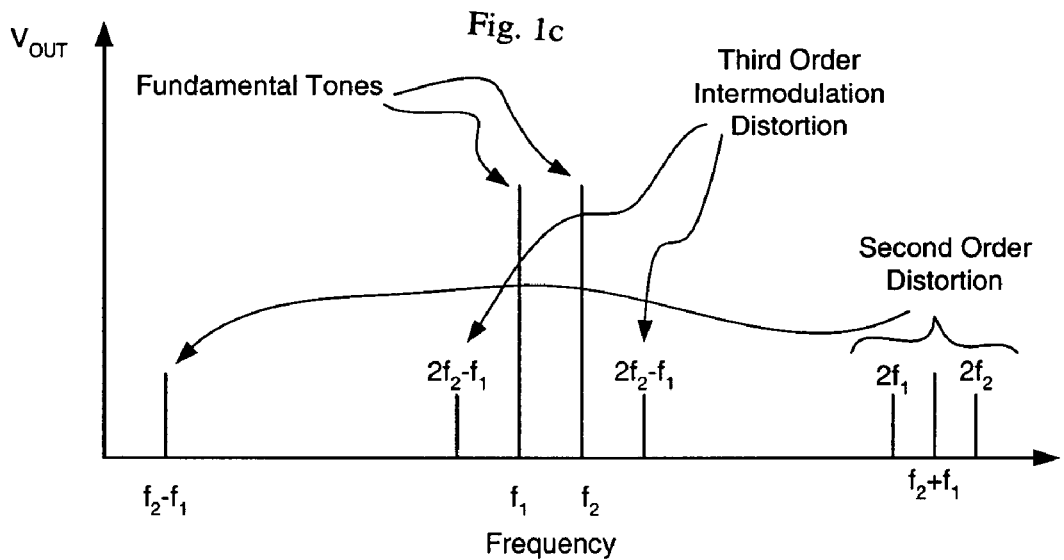
FIG. 1c is a graph of output voltage verses frequency for the typical RF amplifier of FIG. 1a showing the fundamental tones at $f_1$ and $f_2$ and $2^{nd}$ and $3^{rd}$ order distortion resulting therefrom.

FIG. 1b is a graph of output voltage verses frequency for the typical RF amplifier of FIG. 1a showing the fundamental tones at $f_1$ and $f_2$ and $2^{nd}$ and $3^{rd}$ order distortion resulting therefrom. Similar distortion products will be generated in the input voltage of the amplifier due to its nonlinear input impedance. On the simultaneous application of the fundamental tones to a typical RF amplifier, the second order mixing term at $f_2-f_1$ appearing in the input voltage modulates the amplifier bias and adds to the IM3 distortion products at $2f_1-f_2$ and $2f_2-f_1$ appearing in the output voltage.

To prevent the difference-frequency mixing term from being generated in the input voltage, the input bias circuit is typically designed to provide a very low impedance at the modulation frequency ($f_2-f_1$). An example of such a bias circuit is shown in FIG. 2.

Figure 2:
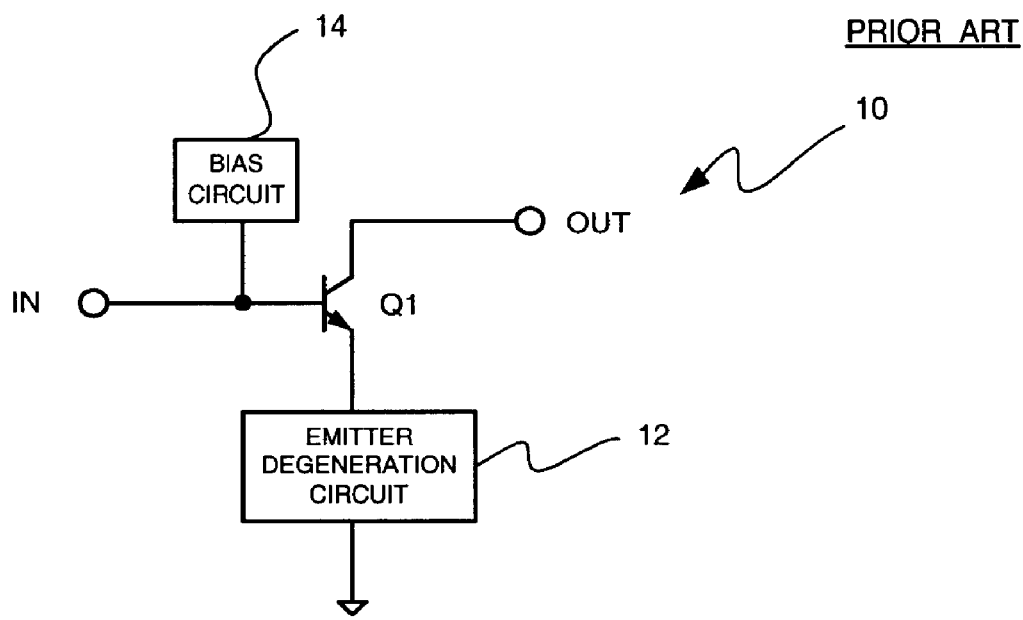
FIG. 2 is a schematic diagram of an arrangement for mitigating third-order intermodulation products constructed in accordance with conventional teachings.

FIG. 2 is a schematic diagram of an arrangement for mitigating intermodulation products constructed in accordance with conventional teachings. In FIG. 2, a transistor Q1 has its emitter connected to ground through an emitter degeneration circuit 12. The emitter degeneration circuit 12 is not always required and is shown for generality. A bias circuit 14 generates the input DC bias voltage applied to the base of the transistor Q1.

The impedance looking into the output of the bias circuit 14 is designed to be very small at low frequencies and, specifically, at the difference frequency ($f_2-f_1$). Thus, the base voltage distortion products at this frequency are significantly attenuated. The output impedance of the bias circuit 14 is designed to be much higher than the transistor input impedance in the operating frequency band to prevent an input RF signal from being shorted by the output of the bias circuit.

The approach taken in FIG. 2 is a typical method of designing low-distortion RF amplifiers so that the amplifiers are not modulated by the input interferers. Unfortunately, with this approach, although modulation by ($f_2-f_1$) is inhibited at the input of the circuit (the base terminal of the transistor Q1), the emitter is free to be modulated if the emitter-degeneration circuit has a nonzero impedance at the modulation frequency.

The collector current of Q1 varies with $V_{be}$ in a nonlinear fashion. The component of the collector current that depends only on the squared base-emitter voltage $V_{be}^2$ is called the second-degree nonlinearity. It mixes together the fundamental tones in the input voltage and produces second-order distortion products. In particular, there will be a distortion product at the difference frequency of $f_2-f_1$ which will be particularly problematic. If the emitter degeneration circuit has a nearly zero ohm impedance at ($f_2-f_1$), the distortion current at ($f_2-f_1$) will not create a voltage drop across it and the base-emitter junction of Q1 will not be modulated and a low IM3 distortion level is achieved. If the emitter degeneration circuit is not zero ohms at ($f_2-f_1$), the difference-frequency product of the collector current creates a $f_2-f_1$ spurious response in the emitter voltage $V_e$. Even though the base voltage $V_b \sim 0$ at $f_2-f_1$, the nonzero $V_e$ at $f_2-f_1$ modulates $V_{be}$ adding to the third-order distortion.

The present invention provides a system and method for holding the base-emitter voltage $V_{be}$ of a bipolar junction transistor constant at the difference frequency ($f_2-f_1$) and reducing the IM3 distortion.

Figure 3:
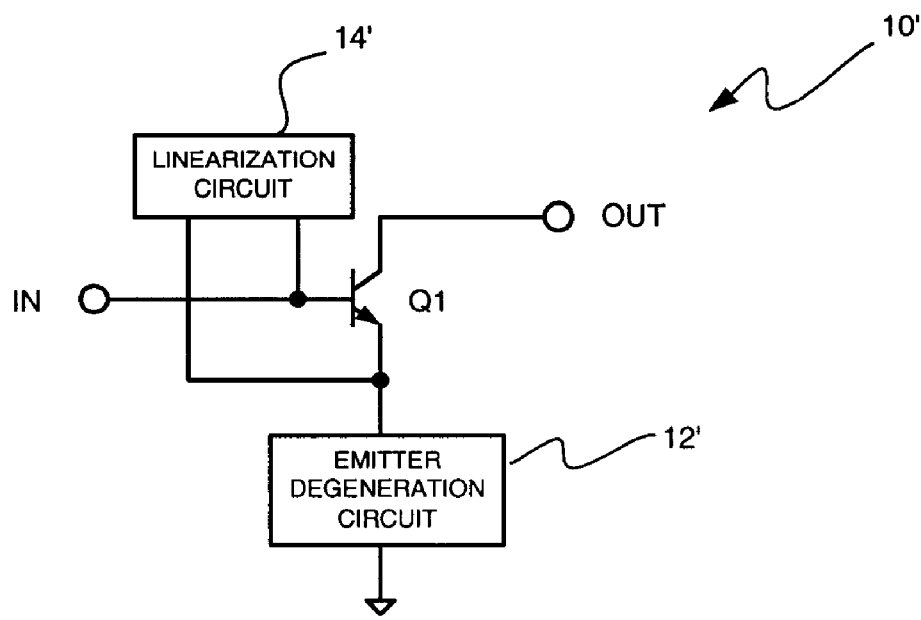
FIG. 3 is a simplified schematic diagram of a linearized circuit including a linearization circuit for mitigating third-order intermodulation distortion in accordance with the teachings of the present invention.

FIG. 3 is a simplified schematic diagram of a linearized RF circuit 10' having an arrangement for mitigating intermodulation distortion in accordance with the teachings of the present invention. The circuit 10' of FIG. 3 is similar to the circuit 10 of FIG. 2 with the exception that the bias circuit 14 is replaced by the linearization circuit 14' with two terminals one of which is connected to the emitter of Q1 and the other one is connected to the base of Q1. The purpose of the linearization circuit 14' is to force the base-emitter voltage $V_{be}$ to be zero at the difference frequency ($f_2-f_1$). The linearization circuit is designed so that it doesn't interfere with Q1 amplification of an input RF signal.

Figure 4:
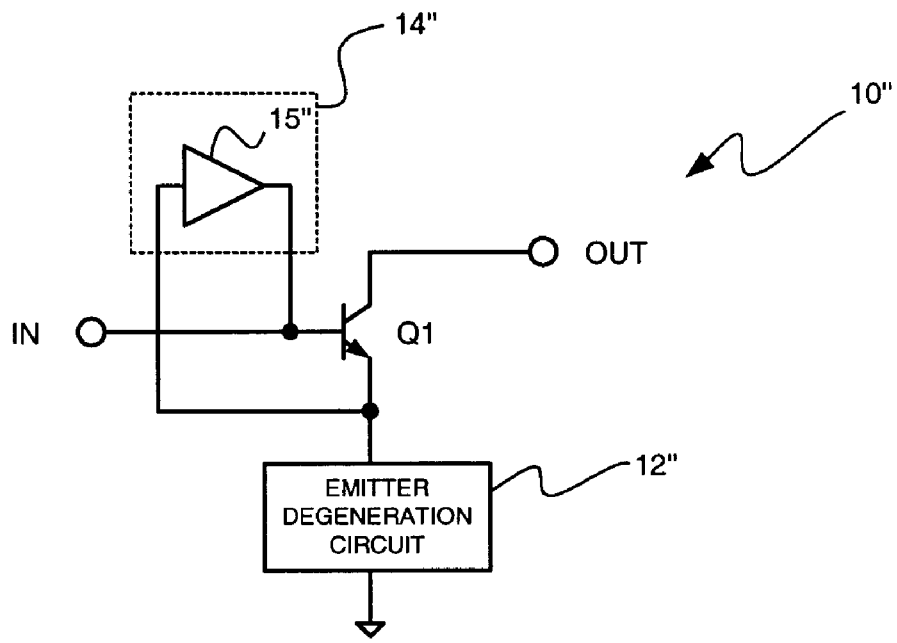
FIG. 4 shows a linearized circuit with a linearization circuit implemented as a non-inverting unity gain buffer

FIG. 4 shows the linearized circuit 10" of the present invention with the linearization circuit 14" implemented as a non-inverting unity gain buffer 15". The input of the buffer is connected to the emitter of Q1 and the output is connected to the base of Q1. The buffer is designed so that its gain is unity and its output impedance is low at the difference frequency ($f_2-f_1$). It forces the base voltage of Q1 to follow the emitter voltage of Q1 resulting in a zero $V_{be}$ at this frequency. The buffer gain is sufficiently low and its output impedance is high at the frequencies of the input signals $f_1$ and $f_2$ to allow their amplification by Q1.

Figure 5:
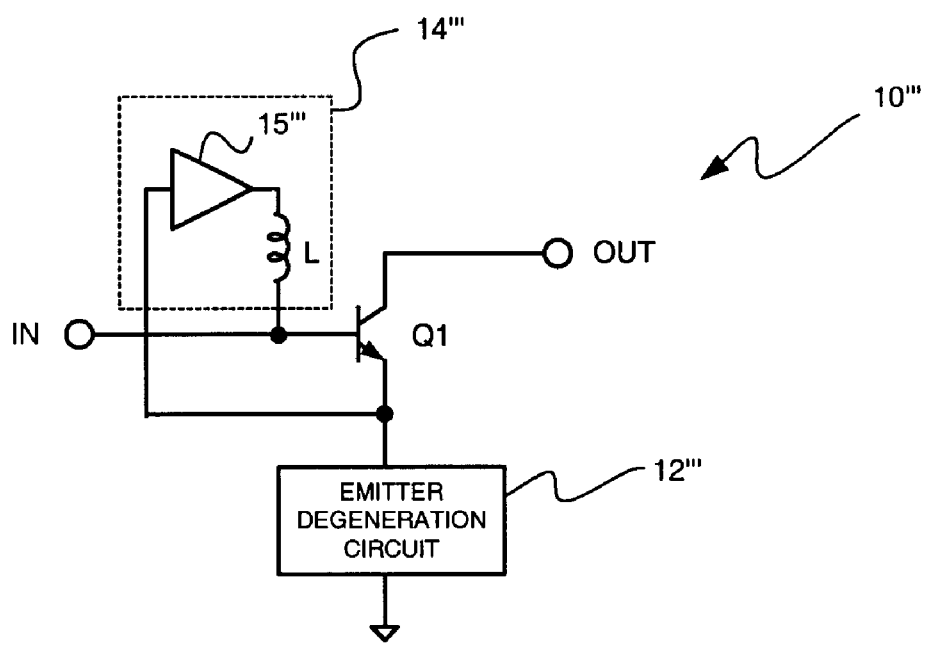
FIG. 5 is similar to FIG. 4 with the exception that a choke coil is inserted between the output of the unity gain buffer and the base of Q1.

The requirement to the buffer output impedance to be low at low frequencies and high at high frequencies can be met if the output impedance is designed to be inductive. There are several approaches to achieve this design goal. The simplest one is to add an inductive choke coil in series with the buffer output designed to have a low impedance in a wide range of frequencies as shown in FIG. 5. The other possible approach is to implement the unity gain buffer as an 'active inductor'.

FIG. 5 is similar to FIG. 4 with the exception that the choke coil L is inserted between the output of the unity gain buffer 15''' and the base of Q1. Since the inductor L appears as an open circuit at RF frequencies isolating the output of the unity gain buffer from the base of Q1, the buffer output impedance is no longer required to be high at these frequencies. At the difference frequency ($f_2-f_1$), the inductor L has a very low impedance that doesn't prevent the buffer from forcing the base voltage of Q1 to follow its emitter voltage. The buffer is still required to have a low impedance at the difference frequency to short out the distortion products in the base of Q1.

Figure 6:
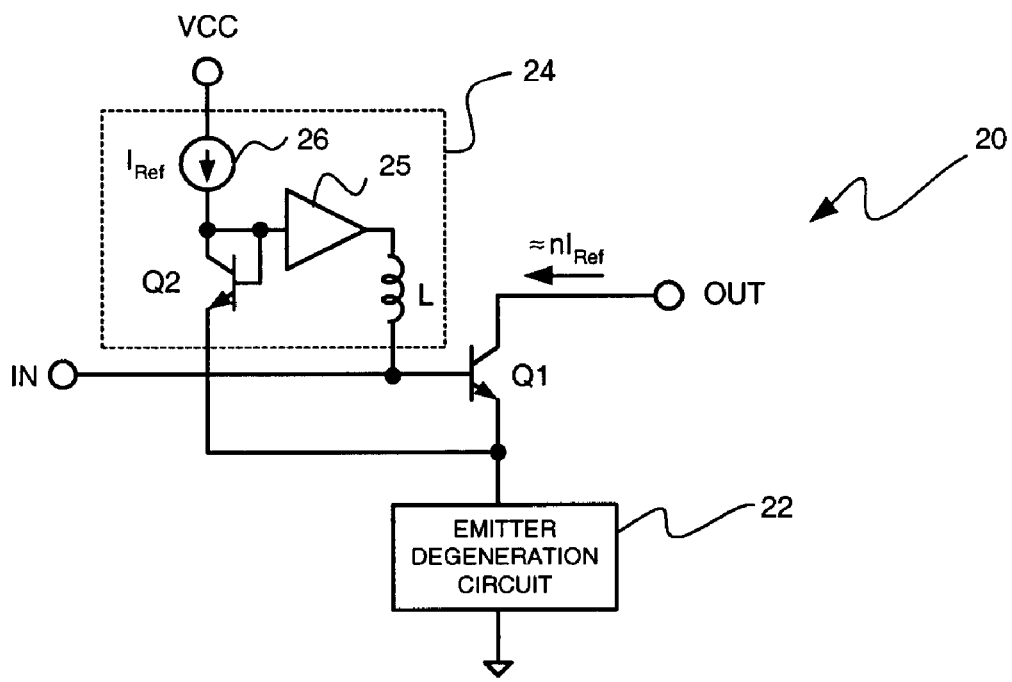
FIG. 6 is similar to FIG. 5 with the exception that an arrangement for providing a DC offset between the terminals of the linearization circuit.
Figure 7:
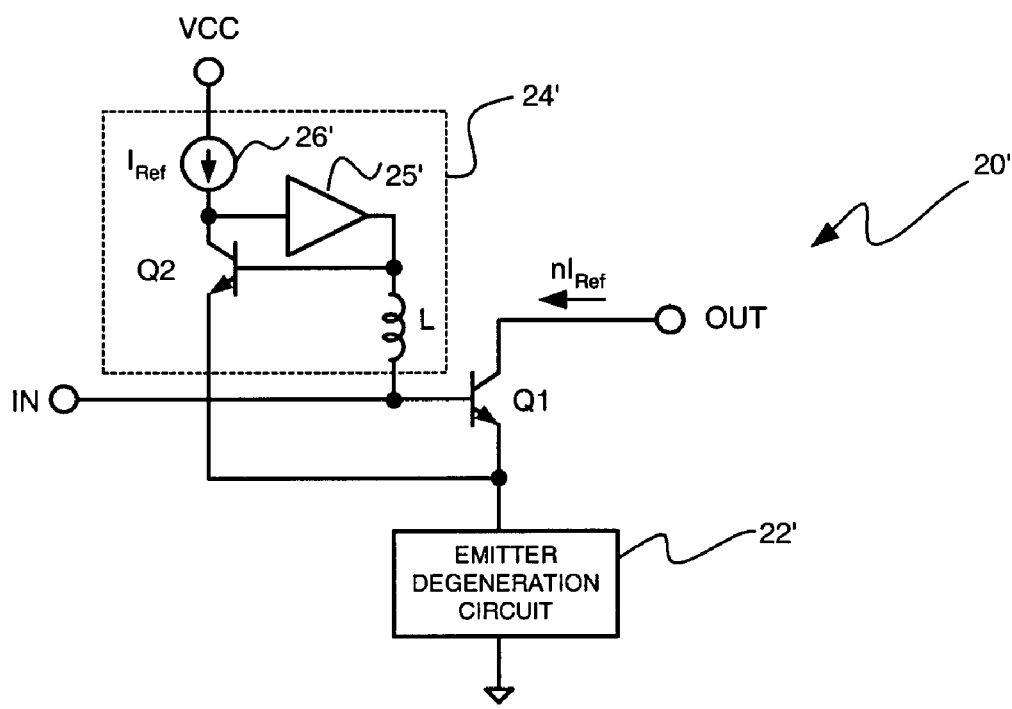
FIG. 7 is similar to FIG. 6 with the exception that the base of Q2 is connected to the output of the unity-gain buffer.
Figure 8:
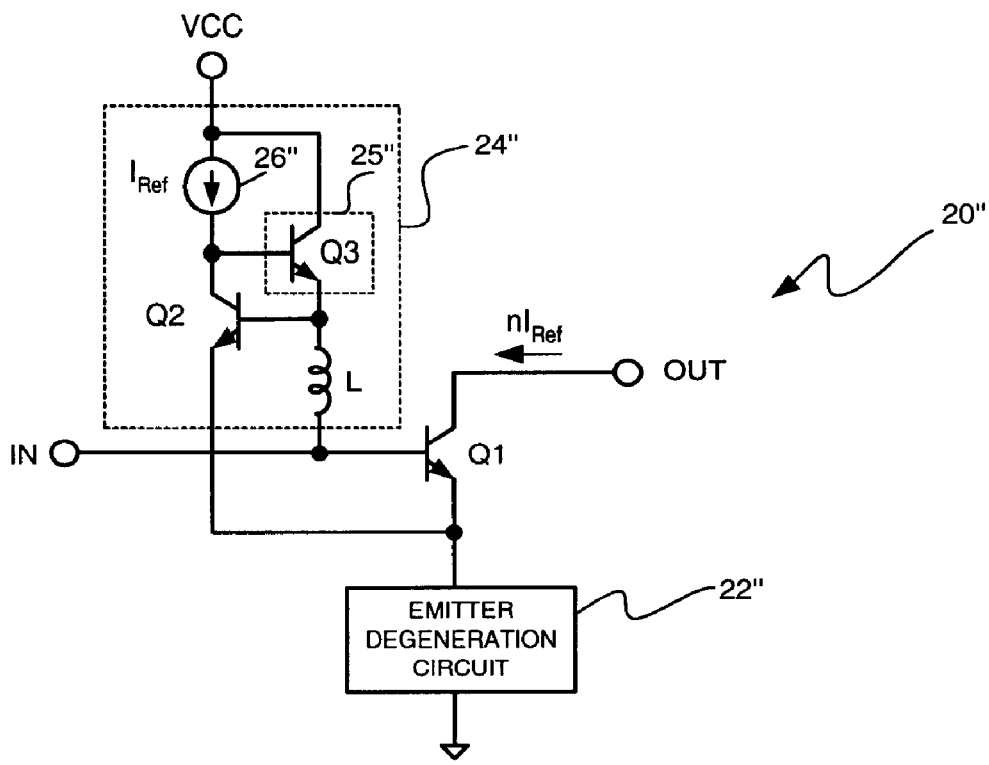
FIG. 8 is similar to FIG. 7 with the exception that Q3 emitter follower replaces the unity gain buffer in accordance with the teachings of the present invention.

To set the desired bias point of the transistor, the linearization circuit 14''' should have a DC offset between its terminals. More specifically, the terminal that is connected to the base of Q1 should be at a higher potential than the terminal connected to the emitter of Q1. FIGS. 6, 7 and 8 show how the invention can be used in combination with a desired $V_{be}$ bias circuit.

FIG. 6 shows the linearized circuit 20 of the present invention with an arrangement for providing a DC offset between the terminals of the linearization circuit 24. The unity gain buffer 25 forces the DC base voltage of Q2 set by the reference current $I_{ref}$ to appear at the base of Q1. Consequently, $V_{be}$ of Q1 is equal to $V_{be}$ of Q2 at DC or close to DC. If Q1 and Q2 have equal emitter area, both of them will draw the same DC current i.e. $I_{ref}$. Typically though, the emitter area of Q2 (often referred to as the reference device) is n times smaller than the emitter area of Q1. In this case, Q1 draws the DC current of $nI_{ref}$. The current $I_{ref}$ is supplied by a current source 26 such as a P-MOS transistor with a fixed gate source voltage.

In operation, Q2 acts as a level-shifting diode. On the application of the two tones to Q1, there will be a ($f_2-f_1$) mixing product in the emitter voltage of Q1. This product will be shifted in its DC level by Q2 and then forced by the unity gain buffer 25 at its output. The inductor L will act as a short at ($f_2-f_1$) transferring the buffer output directly to the base of Q1. So, the base voltage of Q1 is forced to follow the emitter voltage of Q1 at ($f_2-f_1$) resulting in a constant $V_{be}$. At RF frequencies, the inductor L appears as an open circuit and the emitter voltage of Q1 is isolated from the base of Q1 which allows Q1 to act as a transconductor i.e. to convert the input RF voltage across the base-emitter junction into the output RF current.

One of the drawbacks of the DC bias approach in FIG. 6 is that not all of the reference current $I_{ref}$ flows through the collector of Q2 but only that portion of it left after supplying the Q2 base current $I_{b,Q2}$. Therefore, the collector current drawn by Q1 is $n(I_{ref}-I_{b,Q2})$. Since $I_{b,Q2}=I_{ref}/\beta$ where $\beta$ is the Q2 forward DC current gain, the DC collector current of Q1 is $nI_{ref}(1-1/\beta)$ i.e. a function of the Q2 beta. The latter significantly (50% or more) varies over process and temperature causing a varying DC current of Q1.

The circuit in FIG. 7 is similar to the circuit of FIG. 6 with the exception that the base of Q2 is connected to the output of the unity-gain buffer 25'. Provided that the input impedance of the buffer is very high, all of $I_{ref}$ flows through the collector of Q2. The DC collector current of Q1 is then exactly $nI_{ref}$. The other advantage of the linearization circuit in FIG. 7 is that the unity gain buffer 25' and the transistor Q2 form a negative feedback loop that reduces the output impedance of the buffer by $(1+A_{OL})$. $A_{OL}$ is the open-loop gain computed as the voltage gain from the base of Q2 to its collector.

The circuit of FIG. 8 is similar to the circuit of FIG. 7 with the exception that the unity gain buffer 25'' is implemented as Q3 emitter follower. In FIG. 8, Q2 and Q3 are connected in a current mirror configuration with Q2 being the current mirror reference device and Q3 being a 'beta helper'. Q2, Q3 and the $I_{ref}$ current source act as a unity-gain buffer 15''' in FIG. 5 with an input DC offset. The emitter terminal of Q2 is the input and the emitter of Q3 is the low-impedance output of the buffer. Due to Q3 providing a closed DC-feedback loop around Q2, there will be a difference in voltages between the base and the emitter of Q2 which acts as a DC offset that is required for Q2 to conduct non-zero current $I_{ref}$. The same DC voltage is applied to the base-emitter junction of Q1 setting its DC collector current at $nI_{ref}$.

Figure 9:
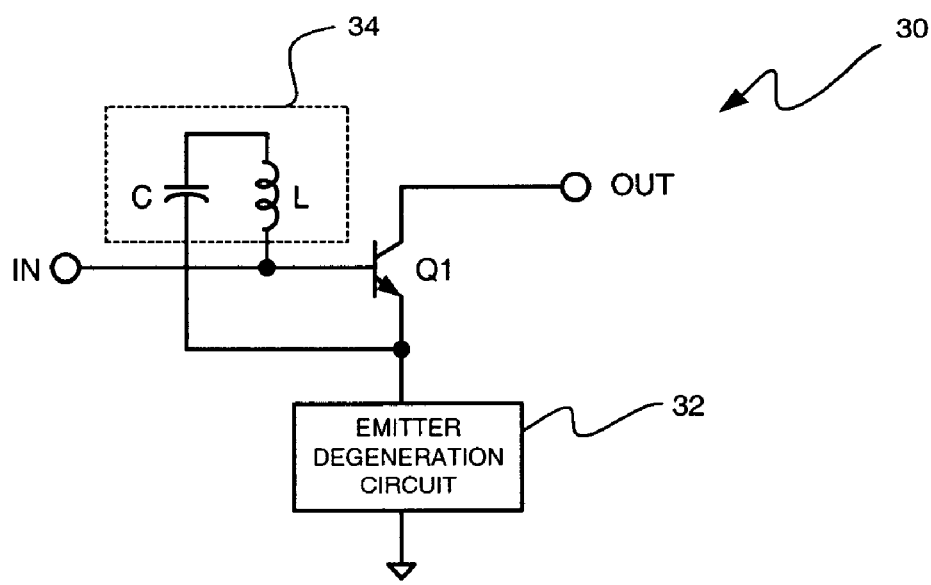
FIG. 9 depicts a first alternative embodiment of the linearized circuit of the present invention.
Figure 10:
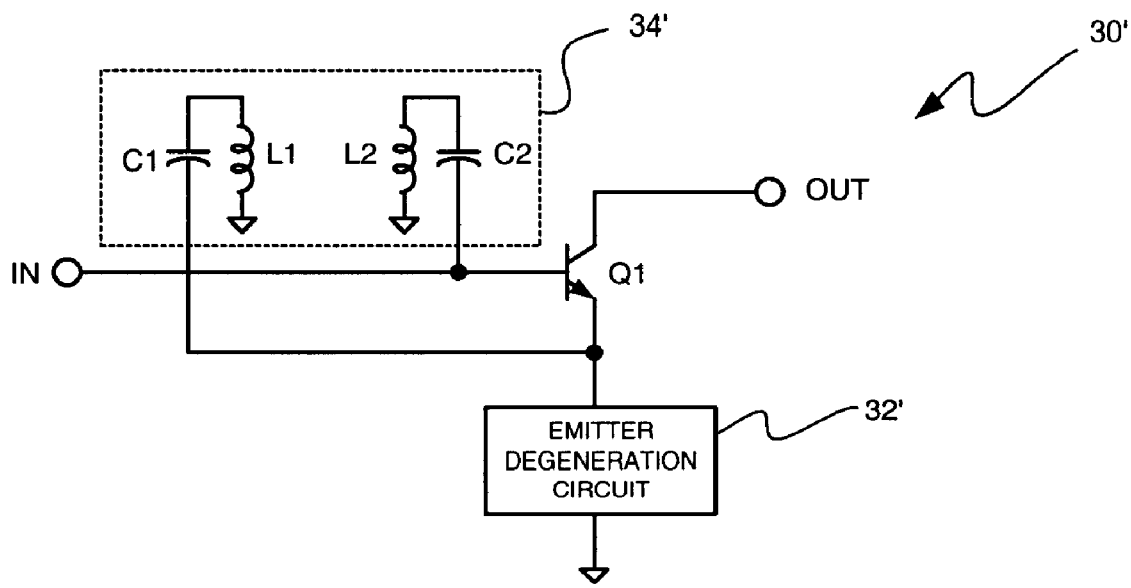
FIG. 10 depicts a second alternative embodiment of the linearized circuit of the present invention.

FIGS. 9 and 10 depict alternative embodiments of the linearized circuit of the present invention. In the circuit of FIG. 9, the linearization circuit 34 is implemented as a capacitor C connected in series with the RF choke inductor L between the base and the emitter of the transistor Q1. The capacitor C should be large enough to create a low impedance path between the base and the emitter of Q1 at low frequencies. The bias for Q1 is generated by other circuitry that is not shown in FIG. 9 for generality. The linearization principle of the circuit in FIG. 9 is based on the capacitor C and the inductor L acting as an AC short between the base and emitter of Q1 at low-frequencies and, specifically, the difference frequency ($f_2-f_1$). At RF frequencies, the high impedance of the inductor L prevents the base and emitter of Q1 to be AC shorted by the capacitor C and Q1 acts as a transconductor.

In FIG. 10, the linearization circuit 34' consists of a first series LC network L1/C1 connected between the emitter of Q1 and ground, and a second series LC network L2/C2 connected between the base of Q1 and ground. The capacitors C1 and C2 are DC blocking capacitors whose capacitance should be large enough to ensure a low impedance to ground at the difference frequency ($f_2-f_1$). Since the inductors L1 and L2 are nearly DC shorts at $f_2-f_1$, the emitter and base of Q1 are individually kept constant at $f_2-f_1$ by the capacitors C1 and C2 respectively. Consequently, $V_{be}$ is also constant. The output of Q1 is its collector. The difference in the approach in FIG. 10 is that there is no connection between the emitter and base of Q1 in the linearization circuit 34'.

Thus, the present invention has been described herein with reference to a particular embodiment for a particular application. Those having ordinary skill in the art and access to the present teachings will recognize additional modifications, applications and embodiments within the scope thereof. For example, transistor Q1 may be a cascode transistor and the emitter-degeneration circuit may be its transconductor, the invention could operate with an RF mixer or other circuit, and/or transistor Q1 could be an input transistor of an amplifier or an active mxer. Furthermore, the invention is not limited to a bipolar-junction transistor implementation. Heterojunction bipolar transistors (HBT's) or field-effect transistors such as MOSFET's, PN-junction FET's, MESFET's and PHEMT's may be used without departing from the scope of the present teachings.

It is therefore intended by the appended claims to cover any and all such applications, modifications and embodiments within the scope of the present invention.

What is claimed is:

1. A linearization circuit for mitigating distortion to an adaptively coupled transistor subject to interferers, the linearization circuit operating in the presence of the interferers to force a control voltage across an input terminal and a common terminal of the transistor to be substantially zero at least at one of (i) a difference frequency of two input signals to the transister and (ii) a modulation frequency of an input carrier to the transistor, wherein the linearization circuit comprises:
   a first series LC network connected between the common terminal of the transistor and ground;
   and a second series LC network connected between the input terminal of the transistor and ground.

* * * * *